United States Patent
Ishioka et al.

(10) Patent No.: US 9,553,217 B2
(45) Date of Patent: Jan. 24, 2017

(54) METHOD OF MANUFACTURING SEMICONDUCTOR DEVICE AND STRUCTURE WITH TRENCHES IN PASSIVATION FILM

(71) Applicant: CANON KABUSHIKI KAISHA, Tokyo (JP)

(72) Inventors: Masao Ishioka, Tokyo (JP); Nobutaka Ukigaya, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/734,155

(22) Filed: Jun. 9, 2015

(65) Prior Publication Data

US 2015/0364510 A1 Dec. 17, 2015

(30) Foreign Application Priority Data

Jun. 17, 2014 (JP) .................................. 2014-124682

(51) Int. Cl.
*H01L 21/00* (2006.01)
*H01L 31/0203* (2014.01)
(Continued)

(52) U.S. Cl.
CPC .......... *H01L 31/0203* (2013.01); *H01L 21/78* (2013.01); *H01L 23/544* (2013.01);
(Continued)

(58) Field of Classification Search
CPC .................. H01L 21/78; H01L 23/544; H01L 2223/54453; H01L 2223/5446
See application file for complete search history.

(56) References Cited

U.S. PATENT DOCUMENTS

2005/0098893 A1* 5/2005 Tsutsue ................. H01L 23/564
257/758
2008/0036485 A1* 2/2008 Nagai ..................... H01L 22/20
324/750.18

(Continued)

FOREIGN PATENT DOCUMENTS

JP 58-197743 A 11/1983
JP 2012-138449 A 7/2012

OTHER PUBLICATIONS

U.S. Appl. No. 14/732,997, filed Jun. 8, 2015, Ukigaya et al.

*Primary Examiner* — Ngan Ngo
(74) *Attorney, Agent, or Firm* — Fitzpatrick, Cella, Harper & Scinto (57) ABSTRACT

A method of manufacturing a semiconductor device is provided. The method includes forming a passivation film on a substrate including a first element region, a second element region adjacent to the first element region in a first direction, a third element region adjacent to the first region in a second direction, and a first scribe region extending to the first direction between the first element region and the third element region, forming a first trench in the passivation film between the first scribe region and the first element region, forming a second trench in the passivation film between the third element region and the first scribe region, and forming a film on the passivation film where the trenches have been formed by coating. The each of trenches is formed continuously along the first and the second element region.

8 Claims, 5 Drawing Sheets

(51) Int. Cl.
*H01L 27/146* (2006.01)
*H01L 31/18* (2006.01)
*H01L 21/78* (2006.01)
*H01L 23/544* (2006.01)

(52) U.S. Cl.
CPC .. *H01L 27/14632* (2013.01); *H01L 27/14685* (2013.01); *H01L 27/14687* (2013.01); *H01L 31/1868* (2013.01); *H01L 2223/54446* (2013.01); *H01L 2223/54453* (2013.01)

(56) References Cited

U.S. PATENT DOCUMENTS

| | | | | |
|---|---|---|---|---|
| 2010/0273312 | A1* | 10/2010 | Noda | H01L 21/78 438/462 |
| 2013/0009270 | A1* | 1/2013 | Tsai | H01L 23/481 257/459 |
| 2013/0181329 | A1* | 7/2013 | Wada | H01L 23/562 257/620 |
| 2014/0239455 | A1* | 8/2014 | Ishii | H01L 23/564 257/620 |

* cited by examiner

METHOD OF MANUFACTURING SEMICONDUCTOR DEVICE AND STRUCTURE WITH TRENCHES IN PASSIVATION FILM

BACKGROUND OF THE INVENTION

Field of the Invention

The present invention relates to a method of manufacturing a semiconductor device and a structure.

Description of the Related Art

In a method of manufacturing a semiconductor device proposed in Japanese Patent Laid-Open No. 58-197743, a passivation film which covers an element region and a scribe region to be diced on a substrate, and has a trench between the element region and the scribe region along the outer edge of the element region is formed. After that, the scribe region is diced. According to this manufacturing method, even if a crack is generated in the passivation film from the scribe region by a mechanical force caused by dicing, the crack is prevented by the trench from expanding to the element region. This reduces this occurrence of the crack, suppresses yield reduction caused by occurrence of the crack which tends to increase in proportion to a dicing speed, and increases a yield and a workability.

SUMMARY OF THE INVENTION

The present inventors have found that the shape of a trench in a passivation film disclosed in Japanese Patent Laid-Open No. 58-197743 may cause a striation in a step of forming a film on the passivation film by coating. Some embodiments of the present invention provide a technique of suppressing occurrence of the striation in the step of forming the film by coating.

According to some embodiments, a method of manufacturing a semiconductor device, the method comprising: forming a passivation film on a substrate including a plurality of element regions and a scribe region, the plurality of element regions including a first element region, a second element region adjacent to the first element region in a first direction, and a third element region adjacent to the first region in a second direction different from the first direction, and the scribe region including, along the first element region and the second element region, a first scribe region extending to the first direction between the first element region and the third element region; forming a first trench in the passivation film between the first scribe region, and the first element region and the second element region, the first trench extending to the first direction; forming a second trench in the passivation film between the third element region and the first scribe region, the second trench extending to the first direction; and forming a film on the passivation film where the first trench and the second trench have been formed by coating, wherein each of the first trench and the second trench is formed continuously along the first element region and the second element region is provided.

According to some other embodiments, a structure comprising a substrate including a plurality of element regions and a scribe region, the plurality of element regions including a first element region, a second element region adjacent to the first element region in a first direction, and a third element region adjacent to the first region in a second direction different from the first direction, and the scribe region including, along the first element region and the second element region, a first scribe region extending to the first direction between the first element region and the third element region; and a passivation film formed on the substrate, the passivation film including a first trench extending to the first direction between the first scribe region, and the first element region and the second element region, and a second trench extending to the first direction between the third element region and the first scribe region, wherein each of the first trench and the second trench is formed continuously along the first element region and the second element region, is provided.

Further features of the present invention will become apparent from the following description of exemplary embodiments (with reference to the attached drawings).

DESCRIPTION OF THE EMBODIMENTS

Concrete embodiments of a semiconductor device and a method of manufacturing the same according to the present invention will be described below. In the following embodiments, a solid-state image sensor will be described as an example of the semiconductor device. However, the present invention is not limited to these embodiments. For example, the present invention can be applied to not only the solid-state image sensor but also another semiconductor device such as a storage device or an arithmetic processing device.

Figure 1:
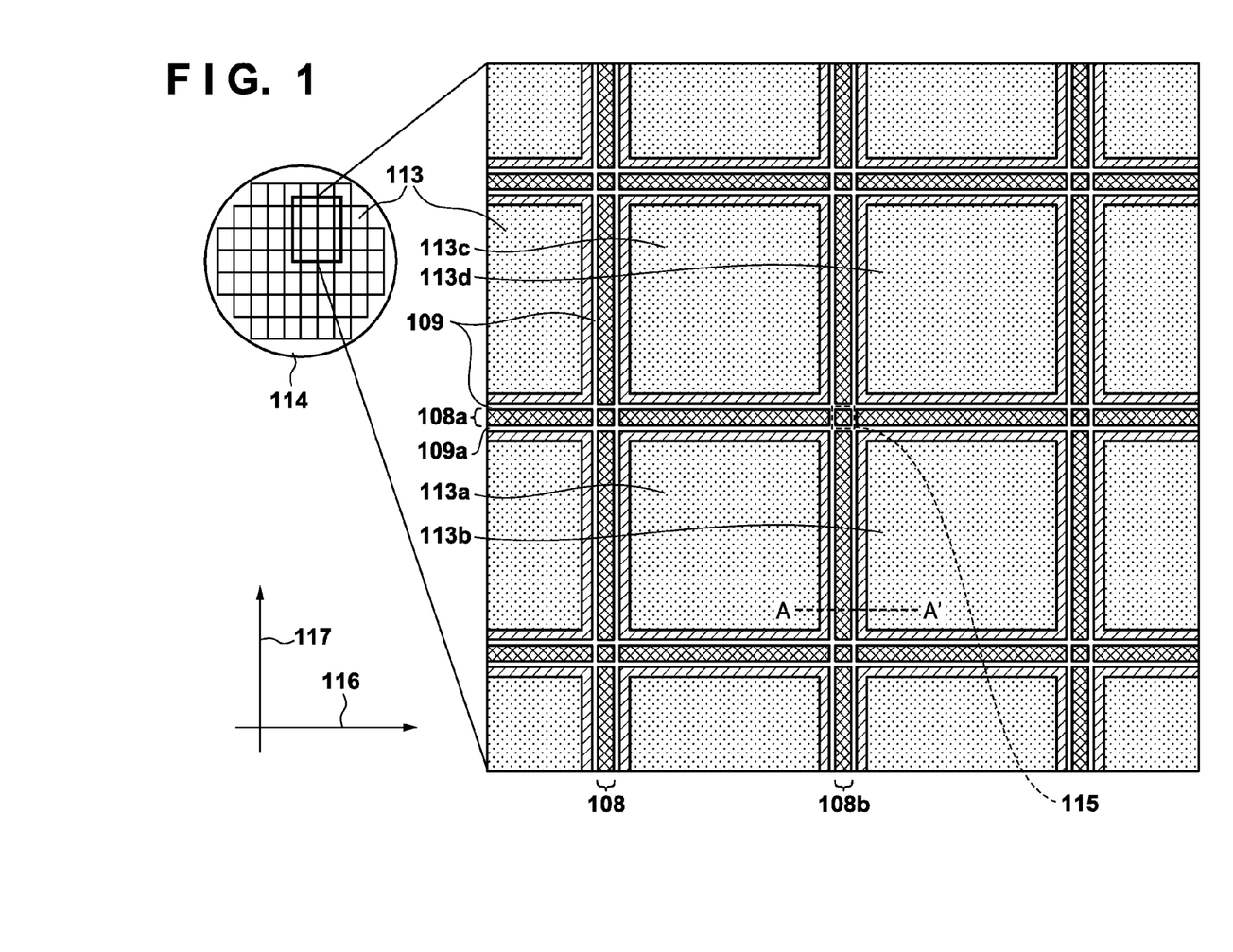
FIG. 1 is a plan view showing a structure according to an embodiment of the present invention.

The solid-state image sensor and a method of manufacturing the same according to some embodiments of the present invention will be described with reference to FIGS. 1 and 2. FIG. 1 is a plan view showing a structure 114 used to form a plurality of solid-state image sensors. FIG. 1 shows the entire and an enlarged part of the structure 114. As shown in an overall view on the left side of FIG. 1, a plurality of element regions 113 in each of which one solid-state image sensor has been formed are arrayed in the structure 114. As will be described later, separate solid-state image sensors are obtained by dicing (cutting) the structure 114. In this embodiment, the plurality of element regions 113 are arrayed in both directions of a first direction 116 and a second direction 117 different from the first direction, and have a matrix shape. Alternatively, the plurality of element regions 113 may only be arrayed in the first direction 116 or the second direction 117. The second direction 117 may be perpendicular to the first direction 116.

The enlarged view on the right side of FIG. 1 shows, out of the plurality of element regions 113, a first element region 113a, a second element region 113b, a third element region 113c, a fourth element region 113d, and their periphery. The structure 114 includes a scribe region 108 to be diced (cut) on the periphery of each element region 113. More specifically, the scribe region 108 may be arranged between the two adjacent element regions 113 or between the element regions 113 and the edge of the structure 114. The scribe region 108 may be formed along the outer edge of each element region 113. If the plurality of element regions 113 is arrayed in the matrix shape, the scribe region 108 has a grid shape. That is, the scribe region 108 is obtained by combining a plurality of regions extending to the first direction 116 and a plurality of regions extending to the second direction 117. The scribe region 108 includes, for example, a first scribe region 108a extending to the first direction 116 as a part thereof. The first scribe region 108a is located between the row of the element regions 113 including the first element region 113a and the second element region 113b and the row of the element regions 113 including the third element region 113c and the fourth element region 113d, and extends along both of these rows. Furthermore, the scribe region 108 includes a second scribe region 108b extending to the second direction 117 as a part thereof. The second scribe region 108b is located between the column of the element regions 113 including the first element region 113a and the third element region 113c and the column of the element regions 113 including the second element region 113b and the fourth element region 113d, and extends along both of these columns. The first scribe region 108a and the second scribe region 108b cross each other in a crossing portion 115.

Figure 2:
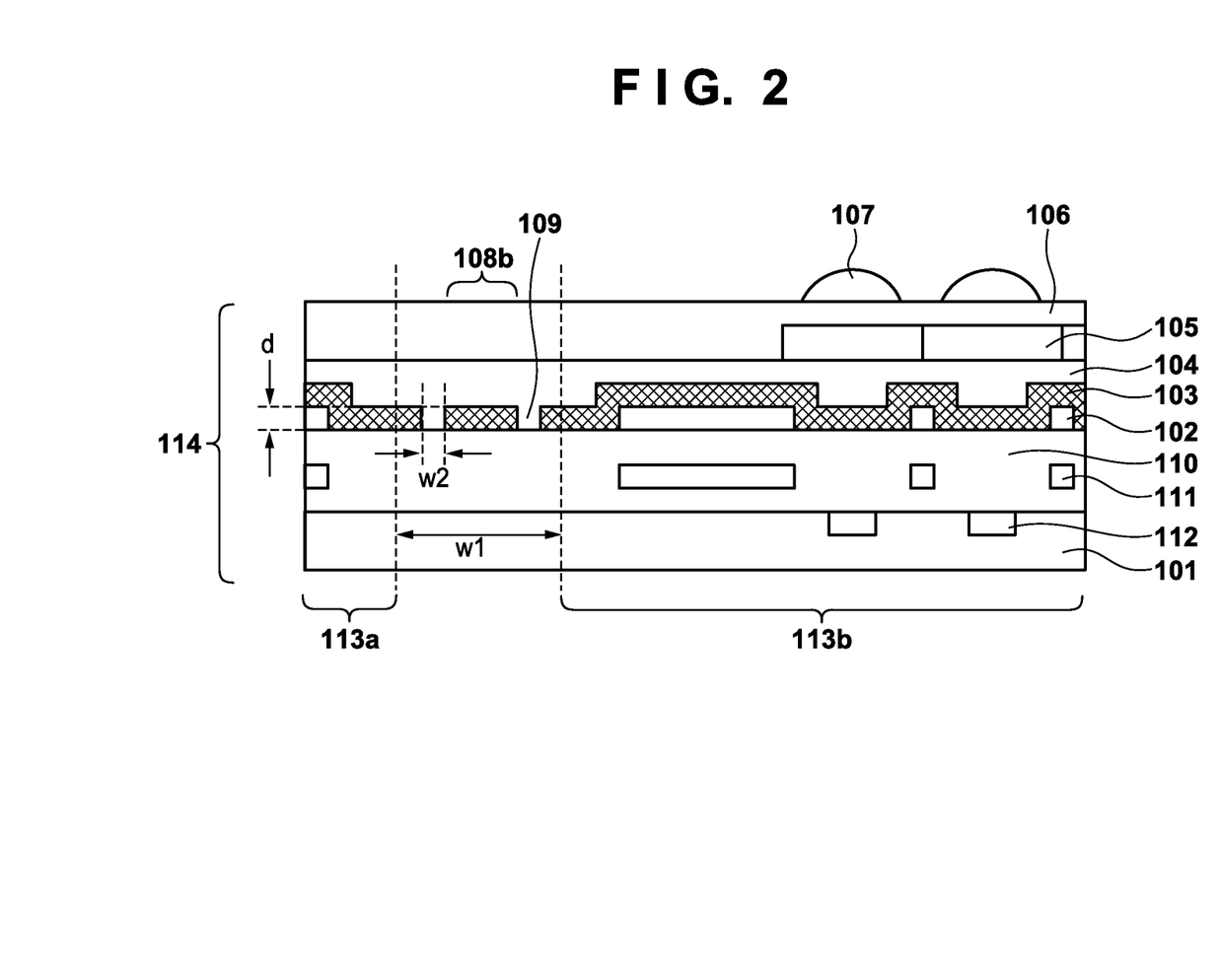
FIG. 2 is a sectional view showing the structure in FIG. 1.

FIG. 2 is a sectional view showing the structure 114 taken along a broken line A-A' in FIG. 1. Semiconductor elements which constitute one solid-state image sensor, such as a photoelectric conversion element 112 which converts incident light into an electrical signal and a transistor (not shown) are formed in each element region 113 of a substrate 101. A wiring interlayer film 110 is formed across the plurality of element regions 113 on the substrate 101. In each element region 113, a wiring layer 111 is formed inside the wiring interlayer film 110 and a wiring layer 102 made of a metal or the like is formed on the wiring interlayer film 110. The wiring interlayer film 110 and the wiring layer 102 are covered with a passivation film 103 formed by a material such as silicon oxide, silicon nitride, or silicon oxynitride. The passivation film 103 is located to cover the entire substrate 101. The thickness of this passivation film 103 is, for example, about 0.5 to 1 μm. On this passivation film 103, a lower planarizing film 104 having a thickness of about 0.5 μm is formed. On the lower planarizing film 104, a color filter 105 having an arbitrary color arrangement is formed, and on the color filter 105, an upper planarizing film 106 exists. On the upper planarizing film 106, microlenses 107 exist. A width w1 between the respective element regions 113 is about 100 μm. Trenches 109 are provided for the passivation film 103 in positions between the element regions 113 and the scribe region 108. The trench 109 has a width w2 of about 10 μm and a depth d of about 0.4 μm. Each trench 109 may penetrate the passivation film 103 or may have a depth midway along the passivation film 103.

Referring back to FIG. 1, the shape of each trench 109 will be described in detail below. If the plurality of element regions 113 is arrayed in the matrix shape, the trenches 109 may be arranged in the grid shape. That is, the trenches 109 may be a region obtained by combining the plurality of trenches extending to the first direction 116 and the plurality of trenches extending to the second direction 117. Each trench extending to the first direction 116 is located between the row of the plurality of element regions 113 arrayed in this direction and the scribe region 108 extending along this row, and is formed continuously along the plurality of element regions 113. The trenches 109 include, as a part thereof, a first trench 109a extending to the first direction 116. The first trench 109a is located between the row of the element regions 113 including the first element region 113a and the second element region 113b and the first scribe region 108a, and is formed continuously along the row of element regions 113. The same also applies to each trench, out of the trenches 109, extending to the second direction 117. In this embodiment, these trenches 109 cross each other continuously in the crossing portion 115, of the scribe region 108, between a portion extending to the first direction 116 and a portion extending to the second direction 117.

A method of manufacturing the solid-state image sensor according to the above-described embodiment will now be described. The photoelectric conversion element 112, the wiring layer 111, and the wiring layer 102 are formed on the substrate 101. These arrangements can be formed using an existing method, and thus a detailed description thereof will be omitted. The substrate 101 can be a semiconductor substrate such as silicon. In place of the semiconductor substrate, for example, an insulating substrate formed by a material such as glass or a plastic, or a metal substrate may also be used. In this case, the semiconductor element is formed on this substrate by silicon, germanium, gallium arsenide, or the like. Next, the passivation film 103 formed by the material such as silicon oxide, silicon nitride, or silicon oxynitride is deposited, on the substrate 101, using a CVD apparatus or the like so as to cover the upper portion of the wiring layer 102 and the scribe region 108. A pad portion to which a lead wire is connected at the time of mounting needs to be electrically connected. Therefore, a mask pattern whose portion above the pad portion is opened by photolithography is formed and a portion above the pad portion of the passivation film 103 is etched. When performing such photolithography, a mask pattern designed such that a portion between the element regions 113 and the scribe region 108 is also opened in an arbitrary shape is used. This makes it possible to form the trenches 109 between the element regions 113 and the scribe region 108 simultaneously with the pad portion.

As a film for alleviating unevenness caused by the wiring layer 102 and the passivation film 103 existing immediately below the color filter 105, the lower planarizing film 104 is coated and stacked on the passivation film 103 by spin coating. This lower planarizing film 104 is made of an organic material such as AH859 available from JSR Corporation. In this case, a coating method is not limited to spin coating. It may be, for example, slit coating or inkjet. The lower planarizing film 104 is not limited to the organic material but may be a fluid material when coated. This lower planarizing film 104 improves the shape stability of the color filter 105 and also improves the spectral stability of a solid-state image sensor determined by the color filter 105. Successively, the color filter 105 is formed for respective colors and the upper planarizing film 106 is further formed using, for example, the same material as the lower planarizing film 104. Each microlens 107 is formed on the upper planarizing film 106 by an arbitrary method. Each microlens 107 is formed by, for example, a resin and a photosensitive material such as TMRP-10 manufactured by TOKYO OHKA KOGYO CO., LTD. The structure 114 shown in FIG. 1 is manufactured, as described above. After that, this structure 114 is diced in the scribe region 108 and divided into the separate solid-state image sensors.

Figure 4:
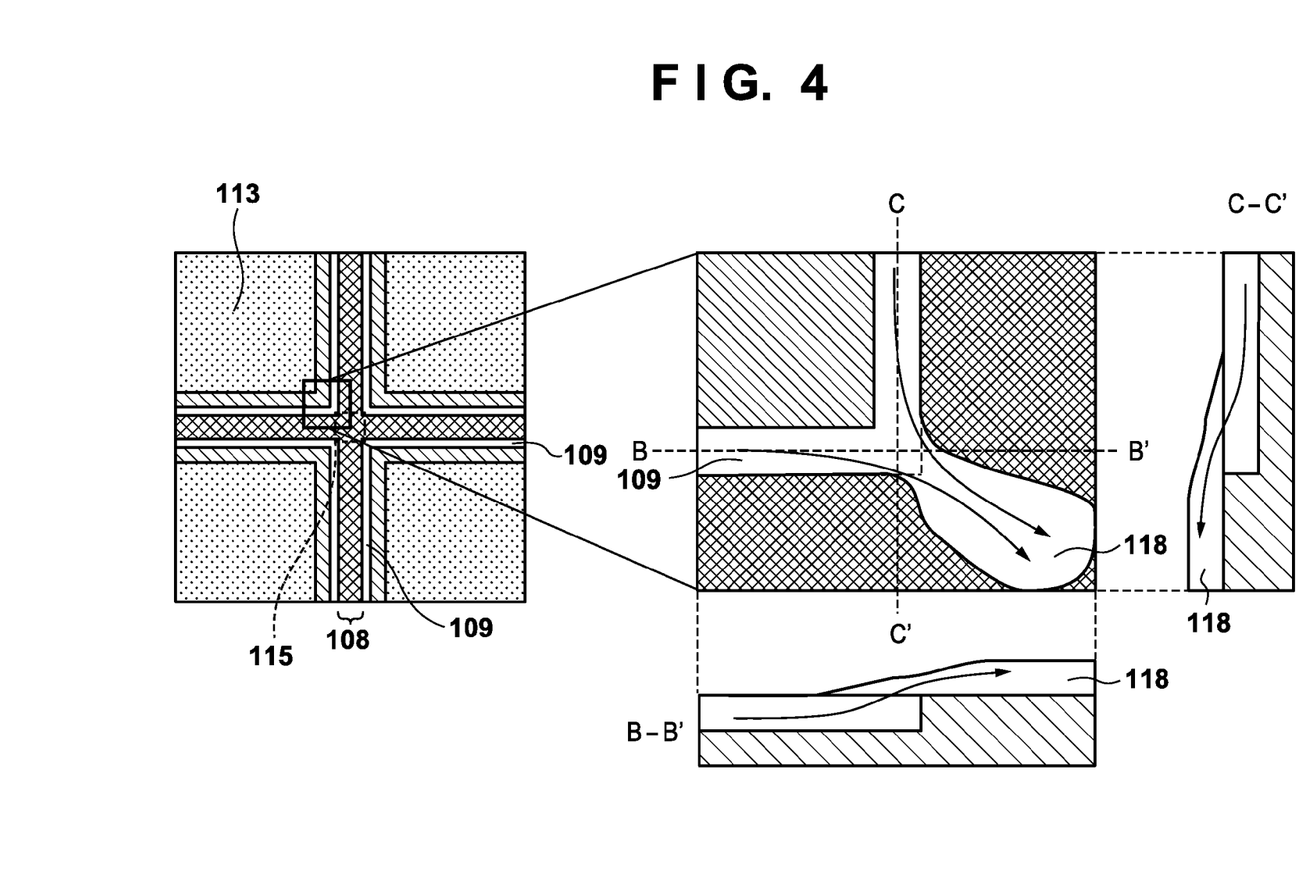
FIG. 4 is a plan view showing the structure according to a comparative example.

The effect of this embodiment will be described with reference to a comparative example in FIG. 4. In the structure of FIG. 4, the trenches 109 are formed separately for the respective element regions 113. When the chemical solution of a material for the lower planarizing film 104 is spin coated on the passivation film 103 where each trench 109 having such a shape is formed, it enters the trench 109. The chemical solution that has entered each trench 109 flows, by a centrifugal force, toward each corner portion existing in the vicinity of the crossing portion 115 in the scribe region. At the corner, the chemical solution is stopped by the wall of each trench existing in its traveling direction and locally overflows. Also, as shown in FIG. 4, chemical solution flows 118 from the both sides of the corner portion are stopped by the walls of the trenches, interfere with each other, and then locally overflow. This causes a striation starting from the periphery of the corner portion of each element region 113. If the striation occurs, variations occur in the characteristics of the formed semiconductor device, decreasing a yield. In a case in which, for example, the semiconductor device is the solid-state image sensor, if a striation occurs when forming the planarizing films, the color filter, or the like on the passivation film by coating, variations occur in the thicknesses of these films. These thickness variations cause variations in an incident light amount to the photoelectric conversion element formed under the planarizing films or the like.

To cope with this, in the structure according to this embodiment shown in FIG. 1, each trench 109 is formed continuously along the two or more element regions 113 and is also formed continuously in the vicinity of the crossing portion 115 in the scribe region 108. It is therefore possible to inhibit the chemical solution from locally overflowing from the vicinity of the crossing portion 115 in the scribe region 108. This makes it possible to suppress occurrence of the striation, and improve both of product performance and a manufacturing yield.

Figure 5A:
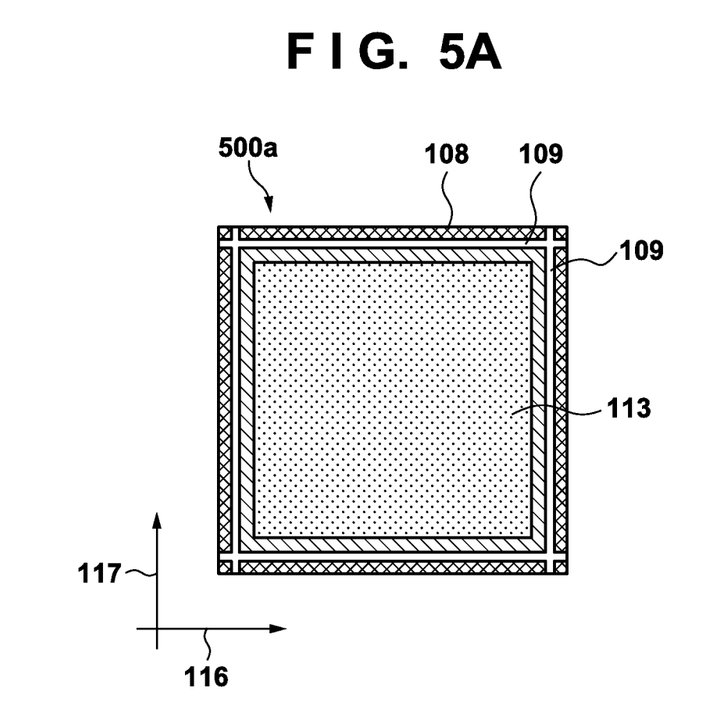
FIG. 5A is a plan view showing a completed solid-state image sensor according to the embodiment of the present invention.
Figure 5B:
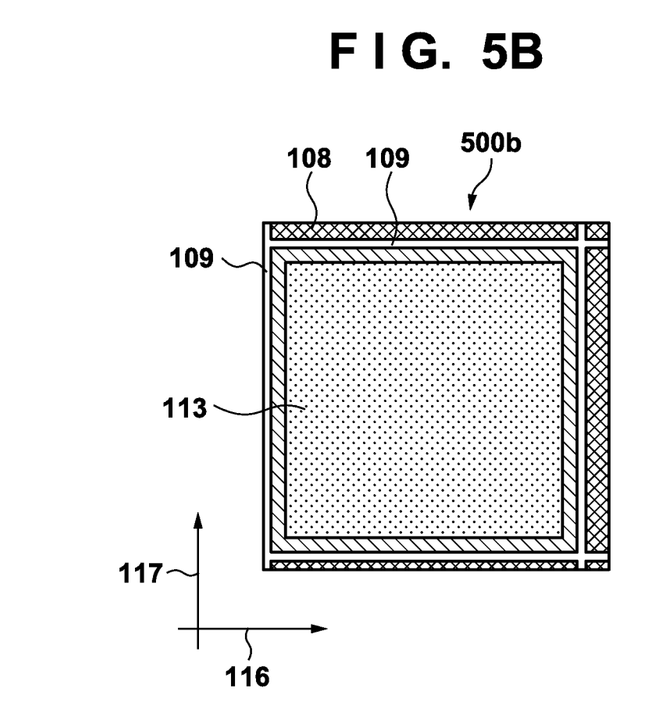
FIG. 5B is a plan view showing the completed solid-state image sensor according to the embodiment of the present invention.

FIGS. 5A and 5B are plan views each showing the completed solid-state image sensor. A solid-state image sensor 500a in FIG. 5A is obtained if dicing is performed in the center of the scribe region 108. A solid-state image sensor 500b in FIG. 5B is obtained if dicing is performed shifted, from the center of the scribe region, in the positive direction of each of the first direction 116 and the second direction 117. In either case, the trenches 109 are formed up to the end portion of the solid-state image sensor, unlike the structure in the comparative example of FIG. 4.

Structures according to various embodiments of the present invention will be described with reference to FIGS. 3A to 3E. The structure in each embodiment may be the same as the structure 114 according to the above-described first embodiment except for the shape of each trench 109 formed in a passivation film 103. Therefore, attention is paid, in each of FIGS. 3A to 3E, to a crossing portion 115 of a scribe region 108 and its periphery.

Figure 3A:
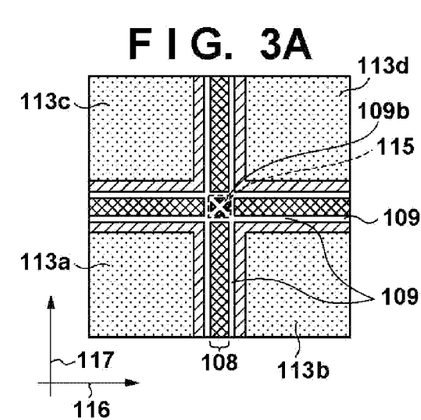
FIGS. 3A to 3E are plan views each showing a structure according to each embodiment of the present invention.

FIG. 3A is a plan view showing the structure according to the second embodiment of the present invention. In this embodiment, the trenches 109 include trenches 109b formed by removing a part of a portion on the crossing portion 115 in the scribe region 108 of the passivation film 103. The trenches 109b are slanted to a trench (for example a trench 109a) formed along the column or the row of a plurality of element regions 113. This makes it possible to further suppress interference caused when chemical solution flows that have reached the crossing portion 115 merge. FIG. 3A shows the slanting trenches 109b provided in two directions. However, the trenches 109b may be provided in only one direction.

Figure 3B:
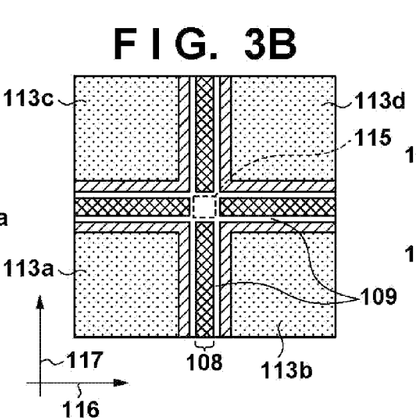

FIG. 3B is a plan view showing a structure according to the third embodiment of the present invention. In this embodiment, the width of each trench 109 changes in a crossing portion 115 of a scribe region 108. In this embodiment, such trenches 109 are formed by completely removing an area which covers the crossing portion 115 of a passivation film 103. This makes the trenches in the crossing portion larger than those in the first embodiment. The larger trenches allow the chemical solution to spread and thus can suppress its overflow. As shown in FIGS. 1 and 3A, the area which covers the crossing portion 115 of the passivation film 103 is smaller in size than an area formed in, for example, each element region 113. For this reason, the passivation film 103 of the crossing portion 115 is likely to scatter as a foreign substance in a dicing step of a substrate 101 after completion of a semiconductor device. This embodiment suppresses the scatter of the foreign substance, resulting in increasing a yield.

Figure 3C:
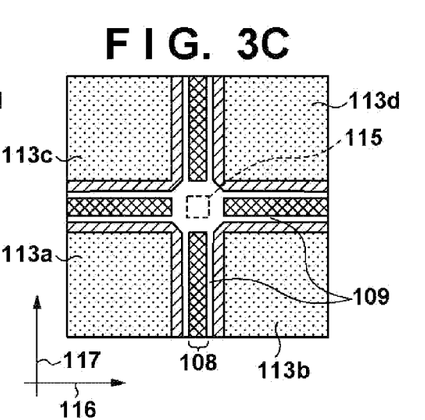
Figure 3D:
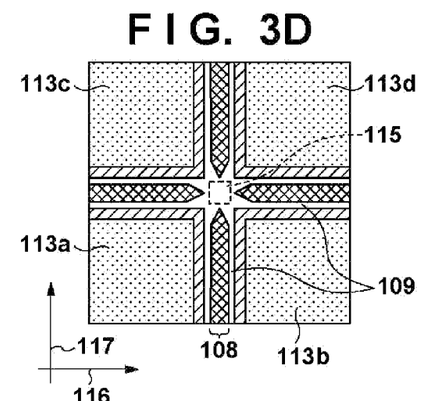

FIG. 3C is a plan view showing a structure according to the fourth embodiment of the present invention. In addition to the structure according to the third embodiment, this embodiment has a structure in which each corner of areas divided by trenches 109 is chamfered. This embodiment has a structure in which the corner of each of the areas covering respective element regions 113a, 113b, 113c, and 113d of a passivation film 103 is chamfered. This prevents a rapid increase in the width of each trench 109 when the chemical solution flows from the trenches 109 to a crossing portion 115 of a scribe region 108 in chemical solution coating by spin coating. Therefore, an interference action caused by the viscosity of the chemical solution or the like is alleviated and its overflow is further suppressed. As a result, occurrence of a striation is suppressed. FIG. 3D shows a structure in which each corner of areas which cover the scribe region 108 is chamfered. The passivation film 103 chamfers some or all of the corners of the areas divided by the trenches 109, as described above. This makes it possible to improve the flow of each chemical solution and suppress occurrence of the striation.

Figure 3E:
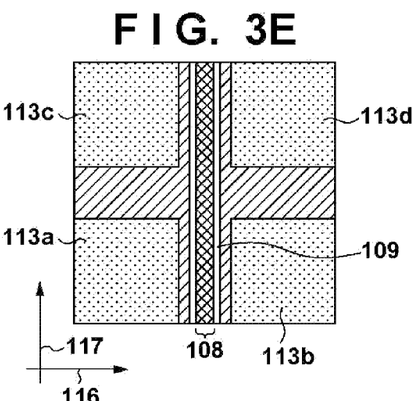

FIG. 3E is a plan view showing a structure according to the fifth embodiment of the present invention. In this embodiment, each trench 109 is formed continuously along at least two element regions 113 in one direction.

The five embodiments of the prevent invention have been described above. However, the shape of each trench 109 is not limited to these. Each trench may be formed continuously along two or more element regions 113 arrayed in at least one direction. Further, in this embodiment, the sectional structure of each trench is a rectangle, as shown in FIG. 2. The sectional structure of each trench may be a polygon or a circular arc. Furthermore, a film stacked on the passivation film 103 where each trench 109 has been formed is not limited to a planarizing film as long as it is coated.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-124682, filed Jun. 17, 2014 which is hereby incorporated by reference wherein in its entirety.

What is claimed is:

1. A method of manufacturing a semiconductor device, the method comprising:
    forming a passivation film on a substrate including a plurality of element regions and a scribe region, the plurality of element regions including a first element region, a second element region adjacent to the first element region in a first direction, a third element region adjacent to the first element region in a second direction different from the first direction, and a fourth element region adjacent to the second element region in the second direction, and the scribe region including a first scribe region extending in the first direction between a first row of element regions including the first element region and the second element region and a second row of element regions including the third element region and the fourth element region, a first portion extending in the second direction between the first element region and the second element region, and a second portion extending in the second direction between the third element region and the fourth element region;

forming a first trench in the passivation film between the first scribe region and the first row of the element regions, the first trench extending in the first direction;

forming a second trench in the passivation film between the second row of element regions and the first scribe region, the second trench extending in the first direction; and forming a film on the passivation film where the first trench and the second trench have been formed by coating, wherein the first trench extends continuously along the first element region, the second element region, and the first portion, and wherein the second trench extends continuously along the third element region, the fourth element region, and the second portion.

2. The method according to claim 1, wherein the scribe region further includes a second scribe region including the first portion and the second portion, and extending in the second direction between a third row of element regions including the first element region and the third element region, and a fourth row of element regions including the second element region and the fourth element region, wherein the first scribe region includes a third portion extending in the first direction between the first element region and the third element region, and a fourth portion extending in the first direction between the second element region and the fourth element region, and wherein the method further comprises:

forming a third trench in the passivation film between the second scribe region and the third row of element regions, the third trench extending in the second direction; and forming a fourth trench in the passivation film between the fourth row of element regions and the second scribe region, the fourth trench extending in the second direction, wherein the third trench extends continuously along the first element region, the third element region, and the third portion, and wherein the fourth trench extends continuously along the second element region, the fourth element region, and the fourth portion.

3. The method according to claim 2, wherein some or all of portions, of the passivation film, surrounded by the first trench, the second trench, the third trench, and the fourth trench are removed.

4. The method according to claim 2, wherein some or all of corners of a plurality of areas, of the passivation film, divided by the first trench, the second trench, the third trench, and the fourth trench are chamfered.

5. The method according to claim 4, wherein some or all of corners, of the plurality of areas, of an area covering the first element region, an area covering the second element region, an area covering the third element region, and an area covering the fourth element region are chamfered.

6. The method according to claim 4, wherein some or all of corners, of the plurality of areas, of an area sandwiched between the first trench and the second trench, and an area sandwiched between the third trench and the fourth trench are chamfered.

7. The method according to claim 1, further comprising cutting the substrate in the scribe region after forming the film.

8. The method according to claim 1, wherein the semiconductor device is a solid-state image sensor.

* * * * *